(12) United States Patent
Yang et al.

(10) Patent No.: US 11,355,708 B2
(45) Date of Patent: Jun. 7, 2022

(54) METHOD FOR MANUFACTURING DISPLAY SUBSTRATE, METHOD FOR MANUFACTURING MASK PLATE AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 16/493,189

(22) PCT Filed: Jan. 31, 2019

(86) PCT No.: PCT/CN2019/074123
§ 371 (c)(1),
(2) Date: Sep. 11, 2019

(87) PCT Pub. No.: WO2019/223366
PCT Pub. Date: Nov. 28, 2019

(65) Prior Publication Data
US 2021/0359211 A1 Nov. 18, 2021

(30) Foreign Application Priority Data
May 23, 2018 (CN) .......................... 201810503120.1

(51) Int. Cl.
*H01L 51/00* (2006.01)
*H01L 27/32* (2006.01)
*H01L 51/52* (2006.01)

(52) U.S. Cl.
CPC ........ *H01L 51/0021* (2013.01); *H01L 27/323* (2013.01); *H01L 51/5221* (2013.01)

(58) Field of Classification Search
CPC ............... H01L 51/0021; H01L 27/323; H01L 51/5221; H01L 27/1288
See application file for complete search history.

(56) References Cited

U.S. PATENT DOCUMENTS 8,653,543 B2 * 2/2014 Yokoyama .......... H01L 51/0096
257/88
9,379,325 B2 * 6/2016 Lee ..................... H01L 27/3211
(Continued)

FOREIGN PATENT DOCUMENTS

| CN | 1797713 A | 7/2006 |
| CN | 101378107 A | 3/2009 |

(Continued)

OTHER PUBLICATIONS

Office Action received for Chinese Patent Application No. 201810503120.1, dated Apr. 26, 2020, 15 pages (8 pages of English Translation and 7 pages of Office Action).

(Continued)

*Primary Examiner* — Bitew A Dinke
(74) *Attorney, Agent, or Firm* — Womble Bond Dickinson (US) LLP

(57) ABSTRACT

The present disclosure relates to the field of manufacturing displays, and provides a method for manufacturing a display substrate, a method for manufacturing a mask plate, and a display device. The method for manufacturing a display substrate comprises: providing a first substrate; providing a mask plate opposite to the first substrate, the mask plate comprising one or more light-transmissive regions, and an electrically conductive material is provided on a surface of the mask plate facing the first substrate; and irradiating a surface of the mask plate facing away from the first substrate with light rays, such that the electrically conductive material is transferred to a surface of the first substrate facing the mask plate, thereby forming an electrically conductive layer (Continued)

having one or more electrically conductive portions, wherein a projection of each of the one or more electrically conductive portions on the mask plate coincides with a respective light-transmissive region.

6 Claims, 3 Drawing Sheets

(56) References Cited

U.S. PATENT DOCUMENTS

| | | | |
|---|---|---|---|
| 2006/0073406 A1 | 4/2006 | Kang et al. | |
| 2006/0128054 A1 | 6/2006 | Kim et al. | |
| 2008/0026543 A1* | 1/2008 | Miyairi | H01L 27/1266 438/455 |
| 2009/0220706 A1* | 9/2009 | Yamazaki | H01L 51/0013 427/596 |
| 2015/0059643 A1 | 3/2015 | Du et al. | |
| 2015/0132875 A1* | 5/2015 | Lee | H01L 51/0011 438/29 |
| 2015/0380650 A1* | 12/2015 | Kang | C23C 14/042 438/29 |
| 2016/0085146 A1* | 3/2016 | Kwon | G03F 1/38 430/5 |
| 2016/0254452 A1 | 9/2016 | Zhao et al. | |
| 2020/0333906 A1* | 10/2020 | Lu | G06F 3/044 |

FOREIGN PATENT DOCUMENTS

| | | | | |
|---|---|---|---|---|
| CN | 103451598 A | | 12/2013 | |
| CN | 103882374 A | | 6/2014 | |
| CN | 106702319 A | | 5/2017 | |
| CN | 107168578 A | * | 9/2017 | ............ H01L 51/56 |
| CN | 108445711 A | | 8/2018 | |
| CN | 108598132 A | | 9/2018 | |

OTHER PUBLICATIONS

International Search Report received for PCT Patent Application No. PCT/CN2019/074123, dated Apr. 18, 2019, 6 pages (2 pages of English Translation and 4 pages of Original Document).

* cited by examiner

METHOD FOR MANUFACTURING DISPLAY SUBSTRATE, METHOD FOR MANUFACTURING MASK PLATE AND DISPLAY DEVICE

CROSS REFERENCE TO RELATED APPLICATION(S)

The present application is a 35 U.S.C. 371 national stage application of the PCT international Application No. PCT/CN2019/074123 filed on Jan. 31, 2019, which claims the priority of the Chinese patent application No. 201810503120.1 filed on May 23, 2018, the entire disclosures of both are incorporated herein by reference.

TECHNICAL FIELD

The present disclosure relates to the field of manufacturing displays, and in particular to a method for manufacturing a display substrate, a method for manufacturing a mask plate, and a display device.

BACKGROUND ART

Organic light-emitting diode (OLED) displays are one of the hot spots in the current research of flat panel displays. As compared with liquid crystal displays, OLED displays have advantages such as low energy consumption, low production cost, self-luminance, wide angle of view, high response speed and the like. Nowadays, OLED display screens have begun to replace traditional liquid crystal display screens in display fields such as cellphone, personal digital assistant (PDA), digital camera and so on. However, in related arts, OLED display screens (e.g., OLED display screens with an in-cell touch function) are confronted with problems such as high process difficulty, which impedes the promotion and application of related products.

SUMMARY

According to an aspect of the present disclosure, a method for manufacturing a display substrate is provided. The method comprises steps of: providing a first substrate; providing a mask plate opposite to the first substrate, wherein the mask plate comprises one or more light-transmissive regions, and an electrically conductive material is provided on a surface of the mask plate facing the first substrate; and irradiating a surface of the mask plate facing away from the first substrate with light rays, such that the electrically conductive material is transferred to a surface of the first substrate facing the mask plate, thereby forming an electrically conductive layer having one or more electrically conductive portions, wherein a projection of each of the one or more electrically conductive portions on the mask plate coincides with a respective light-transmissive region.

According to a possible implementation, in the method for manufacturing a display substrate provided by embodiments of the present disclosure, the step of providing the mask plate comprises: providing a base substrate; forming a light-shielding layer having one or more openings on a surface of the base substrate facing the first substrate, each of the one or more openings coinciding with a respective light-transmissive region; and forming a planarization layer over a surface of the light-shielding layer facing away from the base substrate.

According to a possible implementation, in the method for manufacturing a display substrate provided by embodiments of the present disclosure, the light-shielding layer comprises a metal material, the metal material being configured to reflect the light rays.

According to a possible implementation, in the method for manufacturing a display substrate provided by embodiments of the present disclosure, the light-shielding layer comprises at least one of silver, molybdenum, tungsten and nickel.

According to a possible implementation, in the method for manufacturing a display substrate provided by embodiments of the present disclosure, the planarization layer is configured to conduct heat in a direction perpendicular to the base substrate.

According to a possible implementation, the method for manufacturing a display substrate provided by embodiments of the present disclosure further comprises a step of: forming a thermally conductive channel comprising metal wires or thermally conductive particles in the planarization layer along the direction perpendicular to the base substrate.

According to a possible implementation, the method for manufacturing a display substrate provided by embodiments of the present disclosure further comprises a step of: prior to irradiating a surface of the mask plate facing away from the first substrate with light rays, disposing the first substrate and the mask plate in a vacuum environment.

According to a possible implementation, in the method for manufacturing a display substrate provided by embodiments of the present disclosure, the light rays are configured to perpendicularly irradiate the surface of the mask plate facing away from the first substrate.

According to a possible implementation, in the method for manufacturing a display substrate provided by embodiments of the present disclosure, the display substrate comprises an OLED touch display substrate, and the electrically conductive layer comprises a cathode touch conductive layer in the OLED touch display substrate.

According to another aspect of the present disclosure, a method for manufacturing a mask plate is further provided, wherein the mask plate is configured to be used in the method according to any of the above embodiments. Specifically, the method for manufacturing a mask plate comprises: providing a base substrate; forming a light-shielding layer having one or more openings on the base substrate, each of the one or more openings coinciding with a respective light-transmissive region; and forming a planarization layer over a surface of the light-shielding layer facing away from the base substrate.

According to yet another aspect of the present disclosure, a display device is further provided. The display device comprises a display substrate manufactured by using the method according to any of the above embodiments.

BRIEF DESCRIPTION OF DRAWINGS

In order to illustrate the technical solutions in embodiments of the present disclosure more clearly, drawings to be used in depiction of the embodiments will be briefly introduced as follows. Apparently, the drawings in the depictions below are only some embodiments of the present disclosure. Reasonable variations of these drawings should also fall within the protection scope of the present disclosure.

DETAILED DESCRIPTION OF EMBODIMENTS

To render goals, technical solutions and advantages of the present disclosure clearer, embodiments of the present disclosure will be further described in detail with reference to the drawings. Apparently, the embodiments described below are only part of the embodiments of the present disclosure, rather than all of them. Based on the described embodiments of the present disclosure, all other embodiments obtainable by a person having ordinary skills in the art without any inventive efforts should fall within the protection scope of the present disclosure. Unless otherwise defined, the technical terms or scientific terms used in the present disclosure should have a common meaning understood by a person having ordinary skills in the art of the present disclosure. The usage of "first", "second" or similar wordings in the present disclosure is only to distinguish between different individuals, instead of indicating any sequence, number or importance. The expression of "comprise" or similar wordings means that elements or objects before the wordings cover elements or objects listed after the wordings and equivalents thereof. In the meanwhile, it does not exclude other elements or objects. The expression of "connect", "join" or similar wordings can comprise electrical connection, rather than be limited to physical or mechanical connection only. Moreover, such connection can be either direct or indirect.

Figure 1:
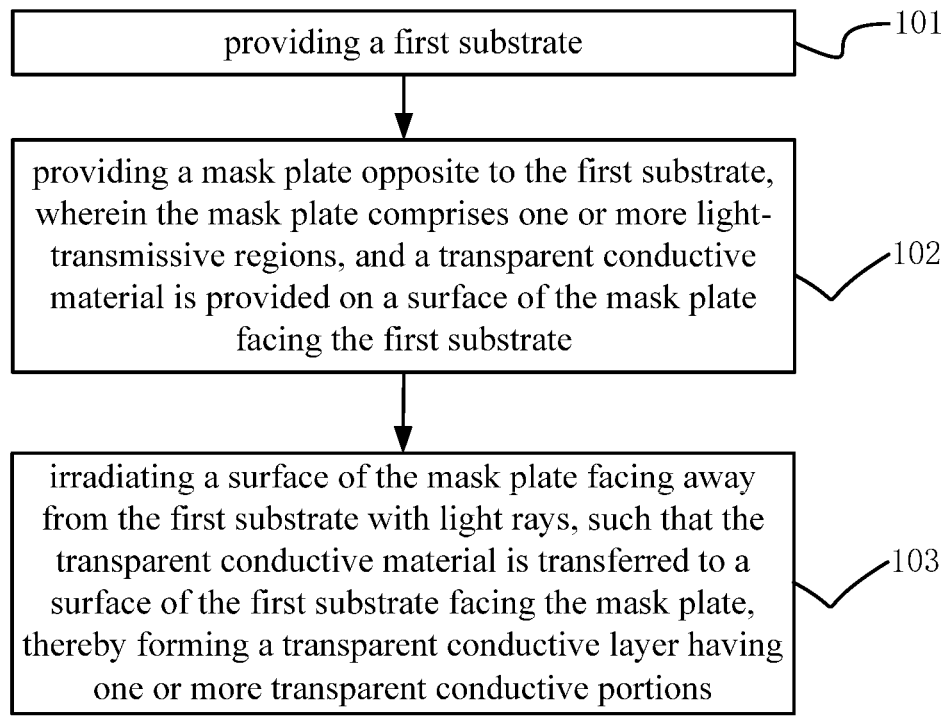
FIG. 1 schematically shows a flow diagram of a method for manufacturing a display substrate according to an embodiment of the present disclosure.

FIG. 1 schematically shows a flow diagram of a method for manufacturing a display substrate according to an embodiment of the present disclosure. Referring to FIG. 1, the method for manufacturing a display substrate comprises: step 101, providing a first substrate; step 102, providing a mask plate opposite to the first substrate, wherein the mask plate comprises one or more light-transmissive regions, and an electrically conductive material is provided on a surface of the mask plate facing the first substrate; and step 103, irradiating a surface of the mask plate facing away from the first substrate with light rays, such that the electrically conductive material is transferred to a surface of the first substrate facing the mask plate, thereby forming an electrically conductive layer having one or more electrically conductive portions. Furthermore, a projection of each of the one or more electrically conductive portions on the mask plate coincides with a respective light-transmissive region. The electrically conductive material can be a transparent conductive material. Specifically, it can be any of indium tin oxide, indium zinc oxide, indium gallium zinc oxide, and indium tin zinc oxide, or comprise a composite metal material such as magnesium silver.

It should be noted that the display substrate can be a substrate structure comprising an electrically conductive layer in any display device, e.g., a display panel, an active matrix substrate, a touch panel, a display touch panel, an array substrate, a color filter, or an intermediate product for any of them during production (e.g., a product motherboard for a plurality of products can be obtained by slicing). The electrically conductive layer can be for example a touch electrode layer in a touch panel, an anode conductive layer and/or a cathode conductive layer in an OLED display panel, or a cathode touch conductive layer which is reused as both an OLED cathode and a touch electrode in an OLED display touch panel.

It should be understood that the first substrate refers to a display substrate in an unfinished state when the electrically conductive layer is to be formed during the manufacture of display substrate, and a lower surface (i.e., the surface facing the mask plate) of the first substrate is a surface on which the electrically conductive layer is to be formed.

It should be further understood that during the formation of electrically conductive layer, the surface of the first substrate for forming the electrically conductive layer thereon is disposed downwards, i.e., facing the mask plate. At this time, the mask plate is located beneath the first substrate, and an electrically conductive material is provided on an upper surface (i.e., the surface facing the first substrate) of the mask plate. The light rays above refer to light rays capable of converting their own energy into the internal energy of the irradiated conductive material so as to raise its temperature. As an example, suitable light rays can be selected according to the material type of the electrically conductive material among the infrared waveband where the thermal effect is relatively remarkable. Exemplarily, when disposed in a vacuum environment, the irradiated conductive material will be transferred (specifically, evaporated) in a vertical direction to the lower surface of the first substrate located above, after being heated to a certain temperature. Meanwhile, the portion of electrically conductive material that is not irradiated can remain unchanged at a low temperature. Accordingly, a patterned electrically conductive layer, e.g., comprising one or more electrically conductive portions, can be formed on the lower surface of the first substrate. It can be understood that the heated portions of electrically conductive material will correspond to the electrically conductive portions of the electrically conductive layer. Therefore, with suitable designs for regions of the electrically conductive material that is irradiated by the light rays, a specified pattern of the electrically conductive layer can be obtained as desired, i.e., comprising a specified distribution of one or more electrically conductive portions. It should be understood that the transversal conduction (i.e., conduction in an extension plane of the mask plate) of heat in the electrically conductive material will disadvantageously cause the actually evaporated region of the electrically conductive material to be greater than the region irradiated by the light rays. Therefore, by selecting the electrically conductive material and/or arranging a heat resistant structure, the transversal conduction of heat in the electrically conductive material can be suppressed, such that the distribution of electrically conductive portions in the electrically conductive layer can be controlled more precisely and more easily. Moreover, collisions between gas molecules in a low vacuum environment or in an air environment will disadvantageously change the movement path of gaseous conductive material molecules, thus causing undesired changes in the distribution of electrically conductive portions in the electrically conductive layer. Therefore, according to embodiments of the present disclosure, a suitable vacuum level can be selected for the environment in accordance with the desired distribution accuracy of the electrically conductive portions.

As for the mask plate, it should be understood that the mask plate is configured to be capable of allowing transmission of the above light rays at least in regions where the electrically conductive material is expected to be irradiated. In an example, the entire surface of the mask plate is transparent to the light rays. In this case, the light rays can perpendicularly impinge on the lower surface of the mask plate, but only in regions where the electrically conductive material is expected to be irradiated, such that the light rays perpendicularly pass through regions of the mask plate where the electrically conductive material is expected to be irradiated. In another example, the mask plate is provided with a patterned light-shielding layer (i.e., comprising one or more openings) capable of preventing transmission of the light rays. In this case, the light rays can impinge on the lower surface of the mask plate entirely and perpendicularly in the form of parallel beams, such that only in the opening regions of the light-shielding layer, can the light rays perpendicularly pass through the mask plate and impinge on the electrically conductive material. Apparently, any suitable implementation for irradiation can be chosen as desired, and the present disclosure may not be limited to the above examples. As an example, in other embodiments of the present disclosure, the electrically conductive material can also be irradiated by using a combination of the above two examples.

It can be seen that in embodiments of the present disclosure, the electrically conductive layer, in particular, one or more electrically conductive portions thereof, is formed by thermally evaporating the electrically conductive material onto a surface of the substrate. Thus, the processing difficulty is greatly reduced as compared with the related art where fine metal mask (FMM) is used. Besides, thermal evaporation can also help to improve the formation accuracy of the patterned electrically conductive layer, and no structures like baffles are required for separating different portions of the electrically conductive layer. Therefore, according to embodiments of the present disclosure, the arrangement and manufacture of structures for separating different electrodes in the electrically conductive layer can also be omitted. As a result, according to embodiments of the present disclosure, the manufacture process for the electrically conductive layer can be simplified, which helps to simplify the manufacture process for the touch OLED display panel and also to improve the product performance of the OLED display panel.

Figure 2:
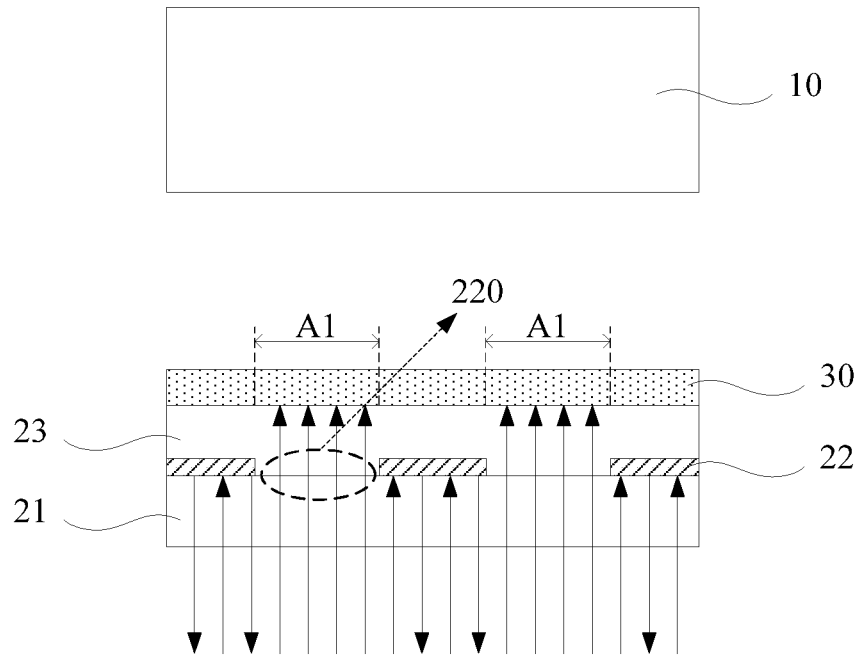
FIGS. 2 and 3 schematically show a process flow of a method for manufacturing a display substrate according to another embodiment of the present disclosure respectively.
Figure 3:
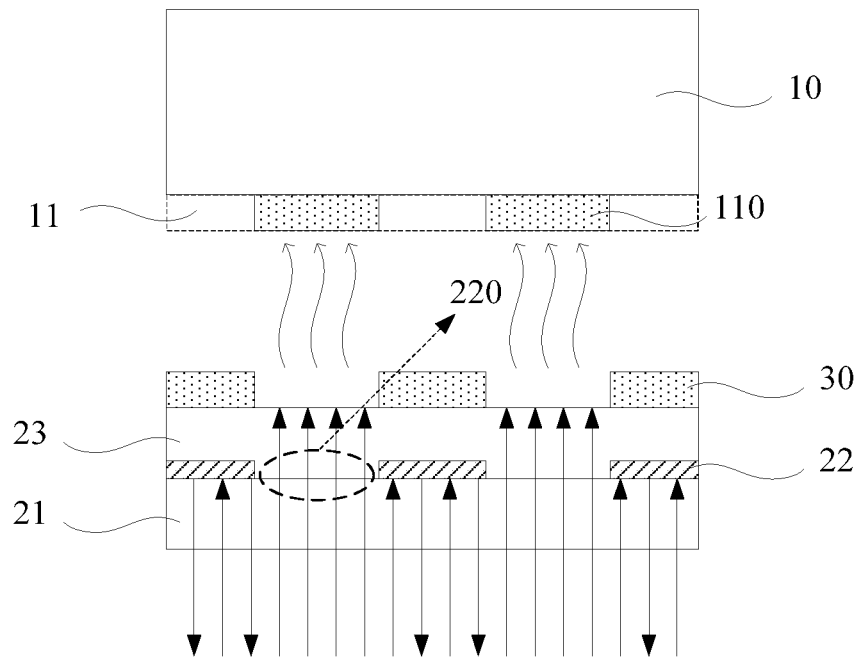

FIGS. 2 and 3 schematically show a process flow of a method for manufacturing a display substrate according to embodiments of the present disclosure. As shown in FIGS. 2 and 3, the mask plate can comprise a base substrate 21, a light-shielding layer 22 and a planarization layer 23, wherein the light-shielding layer 22 comprising one or more openings 220 is located on the base substrate 21, the planarization layer 23 covers the light-shielding layer 22 and the base substrate 21, and the entire surface of the electrically conductive material 30 covers the planarization layer 23. In an example, the light-shielding layer 22 can be formed by a metal material (for example, at least one of silver, molybdenum, tungsten, and nickel). Thereby, the light-shielding layer 22 can shield light by reflecting the light rays. The base substrate 21 and the planarization layer 23 can be formed by a transparent material having a high light transmissivity and a low light absorptivity. For example, the base substrate 21 and the planarization layer 23 can be formed by inorganic glass or an organic polymer material. Besides, when the base substrate 21 and the planarization layer 23 both have a relatively high light absorptivity of light, the planarization layer 23 can be further configured to conduct heat in a thickness direction (i.e., the direction perpendicular to the mask plate). For example, in a region A1 where the electrically conductive material 30 is expected to be irradiated and evaporated (i.e., a light-transmissive region of the mask plate), a thermally conductive channel can be formed in a thickness direction of the planarization layer 23 by means of metal wires or thermally conductive particles. In this case, heat absorbed by the base substrate 21 and the planarization layer 23 will be conducted to the electrically conductive material 30 in a thickness direction. This can avoid the excessively low efficiency for heating the electrically conductive material 30, or the local overheating caused by accumulation of heat within the base substrate 21 and the planarization layer 23.

As shown in FIG. 2, when forming the electrically conductive layer 11, the first substrate 10 is arranged opposite to the mask plate. Specifically, in the first substrate 10, the surface for forming the electrically conductive layer thereon faces downwards, and the mask plate is disposed horizontally beneath the first substrate 10. In this case, optionally, the ambiance is a vacuum environment. Under such a condition, light rays (as indicated by solid arrows in FIGS. 2 and 3) perpendicularly impinge on the lower surface of the base substrate 21 in the mask plate. During the subsequent propagation, light rays impinging on the non-opening regions of the light-shielding layer 22 will be reflected back, while light rays impinging on the opening-regions 220 of the light-shielding layer 22 will pass through the base substrate 21 and the planarization layer 23, and finally impinge onto the electrically conductive material 30. Therefore, as shown in FIG. 3, the portion of the electrically conductive material 30 which is within a light-transmissive region A1 and irradiated will be heated to a certain temperature and then evaporated into gas. After that, gaseous molecules in a vacuum state will move in a vertical direction to the lower surface of the first substrate 10 right above and thus be deposited thereon. In contrast, the portion of the electrically conductive material 30 which is beyond the light-transmissive region A1 and not irradiated can remain unchanged at a low temperature. Accordingly, a patterned electrically conductive layer 11, comprising for example one or more electrically conductive portions 110, can be formed on the lower surface of the first substrate 10. Besides, as can be seen from the above example, the irradiated portions of the electrically conductive material 30 are actually defined by the openings of the light-shielding layer 22. Therefore, as shown in FIG. 3, the pattern in which the one or more openings 220 are distributed in the light-shielding layer 22 will keep coincident with the pattern in which the one or more electrically conductive portions 110 are distributed in the electrically conductive layer 11. That is to say, with a special design for the pattern of openings 220 in the light-shielding layer 22, a desired pattern distribution of the electrically conductive portions 110 in the electrically conductive layer 11 can be obtained.

It should be understood that during the process for manufacturing a display substrate, the electrically conductive material 30 is formed on the mask plate as a consumable or raw material. In an example, each time before forming the electrically conductive layer 11, an entire surface of electrically conductive material 30 can be formed on the planarization layer 23 of the mask plate, for use in the subsequent formation of electrically conductive layer 11. It should be note that in embodiments of the present disclosure, the electrically conductive material 30 formed on the mask plate is used for forming the electrically conductive layer 11 by vacuum coating via thermal deposition. Accordingly, the electrically conductive material 30 should have good thermal contact with the mask plate, and thus be easily separated from the mask plate when it is heated. Therefore, the electrically conductive material 30 can be formed on the mask plate by vacuum coating for example. Moreover, each time after the electrically conductive layer 11 is formed, the electrically conductive material 30 left on the planarization layer 23 of the mask plate can be exemplarily removed or recycled, such that the mask plate can be used again when the electrically conductive layer 11 is formed next time.

Figure 4:
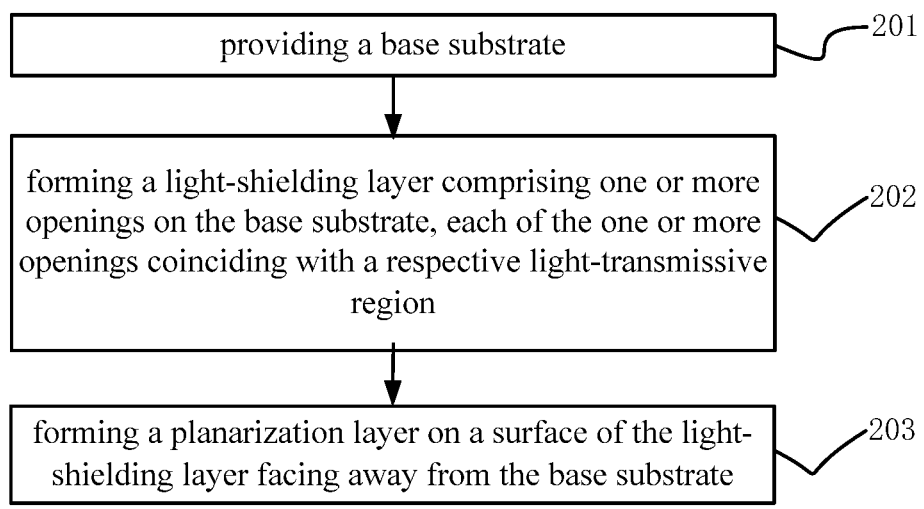
FIG. 4 schematically shows a flow diagram of a method for manufacturing a mask plate according to an embodiment of the present disclosure.

FIG. 4 schematically shows a flow diagram of a method for manufacturing a mask plate according to an embodiment of the present disclosure. The mask plate is a mask plate used in any method for manufacturing a display substrate mentioned above. Referring to FIG. 4, the method for manufacturing a mask plate comprises steps 201, 202 and 203 as follows.

Step 201, providing a base substrate.

Step 202, forming a light-shielding layer comprising one or more openings on the base substrate. Furthermore, each of the one or more openings coincides with a respective light-transmissive region of the mask plate.

In an example, after a surface of the base substrate is cleaned and dried, a metal film can be deposited on the surface of the base substrate by physical vapor deposition (PVD) of a metal material. Furthermore, the metal film can be selectively etched in the following way so as to form a patterned light-shielding layer: coating the metal film with a layer of photoresist by for example spin coating, using UV light to irradiate the photoresist within a region to be etched so as to have it fully exposed, disposing the entire structure in a developer so as to remove by development all photoresist in the region to be etched, using the remnant photoresist as a mask to etch the portion of metal film within the region to be etched, and finally stripping the remnant photoresist so as to form the patterned light-shielding layer as desired.

Step 203, forming a planarization layer over a surface of the light-shielding layer facing away from the base substrate.

In an example, the planarization layer can be formed by a chemical vapor deposition (CVD) process over the light-shielding layer and the base substrate. Furthermore, the upper surface of the deposited planarization layer can be planar. Thus, the manufacturing process of the mask plate per se has been completed.

After the formation of mask plate, an electrically conductive material can be further formed on a surface of the planarization layer facing away from the base substrate.

In an example, an electrically conductive material for forming an electrically conductive layer can be applied over the planarization layer by vacuum coating.

It should be understood that during execution of the method for manufacturing a display panel, the manufacturing process of the mask plate and/or the coating process of the electrically conductive material on the mask plate can be comprised at the same time. Therefore, at least one of the above steps in the method for manufacturing a mask plate can be comprised in the method for manufacturing a display panel.

Figure 5:
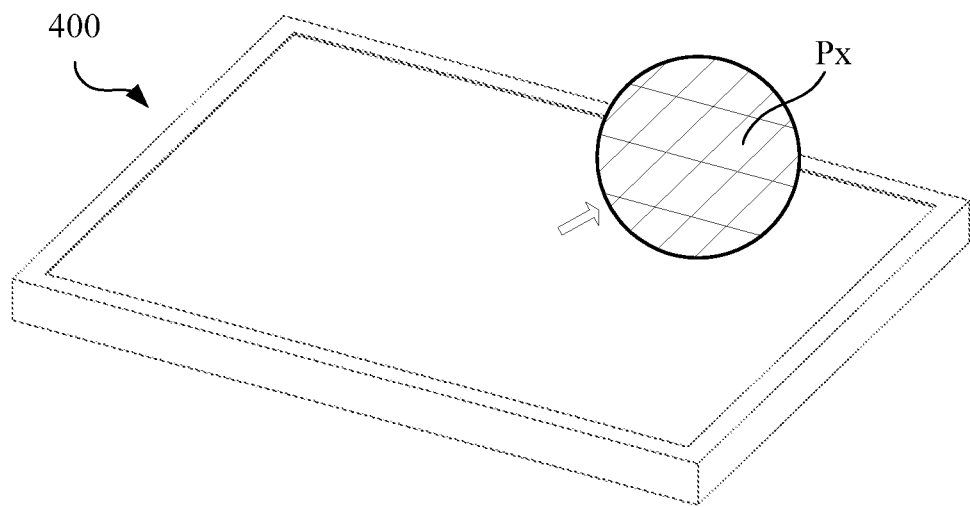
FIG. 5 schematically shows a structure diagram of a display device according to an embodiment of the present disclosure.

Based on a same concept, embodiments of the present disclosure further provide a display device. The display device comprises a display substrate obtained by using any method for manufacturing a display substrate as mentioned above. According to an embodiment of the present disclosure, the display device can be any product or component having a display function, such as a display panel, a cellphone, a tablet computer, a television, a display, a notebook computer, a digital photo frame, a navigator or the like. In an example, as shown in FIG. 5, the display device 400 comprises sub-pixel units Px arranged in rows and columns in a display area. Inside the display device, each of the cathode touch patterns in the conductive layer may cover sub-pixel units Px of multiple rows and multiple columns, and each of the sub-pixel units Px is covered by a cathode touch pattern. Since the manufacturing process of the display substrate comprised therein is simplified and the performance thereof is improved, the manufacturing process of the display device may also be simplified and the performance of the related products may also be improved.

What is mentioned above is only embodiments of the present disclosure and cannot limit the present disclosure. Any amendment, equivalent replacement, and improvement made within the spirit and principle of the present disclosure should fall within the protection scope of the present disclosure.

The invention claimed is:

1. A method for manufacturing a cathode touch conductive layer in an OLED touch display substrate, comprising steps of:
    providing a first substrate;
    providing a mask plate opposite to the first substrate, the mask plate comprising one or more light-transmissive regions;
    providing an electrically conductive material on a surface of the mask plate facing the first substrate; and
    irradiating a surface of the mask plate facing away from the first substrate with light rays, such that the electrically conductive material is transferred to a surface of the first substrate facing the mask plate, thereby forming the cathode touch conductive layer, the cathode touch conductive layer comprising one or more electrically conductive portions,
    wherein a projection of each of the one or more electrically conductive portions on the mask plate coincides with a respective light-transmissive region,
    wherein the providing the mask plate opposite to the first substrate comprises:
    providing a base substrate;
    forming a light-shielding layer having one or more openings on a surface of the base substrate facing the first substrate, each of the one or more openings coinciding with the respective light-transmissive region; and
    forming a planarization layer over a surface of the light-shielding layer facing away from the base substrate,
    wherein the forming the planarization layer comprises forming a thermally conductive channel comprising metal wires or thermally conductive particles in the planarization layer along a direction perpendicular to the base substrate, and
    wherein the providing the electrically conductive material on the surface of the mask plate facing the first substrate comprises forming the electrically conductive material by vacuum coating on a surface of the planarization layer facing the first substrate.

2. The method according to claim 1, wherein, the light-shielding layer comprises a metal material being configured to reflect the light rays.

3. The method according to claim 1, wherein, the light-shielding layer comprises at least one of silver, molybdenum, tungsten, and nickel.

4. The method according to claim 1, further comprising a step of:
    prior to irradiating the surface of the mask plate facing away from the first substrate with light rays, disposing the first substrate and the mask plate in a vacuum environment.

5. The method according to claim 1, wherein,
the light rays are configured to perpendicularly irradiate the surface of the mask plate facing away from the first substrate.

6. A display device, comprising the OLED touch display substrate comprising the cathode touch conductive layer according to claim 1.

* * * * *